United States Patent [19]
Kinbara

[11] Patent Number: 6,137,816
[45] Date of Patent: Oct. 24, 2000

[54] POWER SOURCE CONTROL APPARATUS FOR LASER DIODE

[75] Inventor: Yoshihide Kinbara, Tokyo, Japan

[73] Assignee: Mitsubishi Denki Kabushiki Kaisha, Tokyo, Japan

[21] Appl. No.: 09/144,268

[22] Filed: Aug. 31, 1998

[30] Foreign Application Priority Data

Sep. 9, 1997 [JP] Japan ..................................... 9-243837

[51] Int. Cl.[7] .................................. H01S 3/04; H01S 3/00
[52] U.S. Cl. ............................................... 372/38; 372/35
[58] Field of Search .............................. 372/38, 704, 705, 372/8, 35

[56] References Cited

U.S. PATENT DOCUMENTS

| | | |
|---|---|---|
| 4,400,812 | 8/1983 | Clark et al. . |
| 4,491,742 | 1/1985 | Akamatsu ................................. 307/252 |
| 5,068,862 | 11/1991 | Zimmermann et al. . |
| 5,374,798 | 12/1994 | Kinbara . |
| 5,666,045 | 9/1997 | Grodevant ................................ 323/282 |
| 5,801,375 | 9/1998 | Sasaki et al. ............................. 250/216 |

FOREIGN PATENT DOCUMENTS

| | | |
|---|---|---|
| 0 096 341 A2 | 12/1983 | European Pat. Off. . |
| 0 716 485 A1 | 6/1996 | European Pat. Off. . |
| 0716485 | 6/1996 | European Pat. Off. . |
| 33 42 111 A1 | 5/1984 | Germany . |
| 2537290 | 7/1996 | Japan . |
| 2546146 | 8/1996 | Japan . |

*Primary Examiner*—Frank G. Font
*Assistant Examiner*—Armando Rodriguez
*Attorney, Agent, or Firm*—Sughrue, Mion, Zinn, Macpeak & Seas, PLLC

[57] ABSTRACT

A power source control apparatus has a constant current circuit and plural laser diodes. Switching elements are connected in parallel between anodes and cathodes of the laser diodes. Forward voltage drop of the switching elements is set lower than forward voltage drop of the laser diodes. When constant current output from the constant current circuit flows through the laser diodes, the switching element either short-circuits or opens the anode and cathode of the laser diode. Thus, current path is switched vise versa.

10 Claims, 9 Drawing Sheets

Drive Signal (ST)

FIG.2b

Output Current from Power Source

FIG.2c

Laser Output Command Signal (PO)

FIG.2d

Laser Diode Input Current

FIG.2e

Electric Potential of Output Terminal DA

FIG.13a
Output Drive Signal (PL)
PRIOR ART

FIG.13b
Laser Diode Input Current (I)
PRIOR ART

FIG.13c
Laser Diode Applied Voltage (V)
PRIOR ART

POWER SOURCE CONTROL APPARATUS FOR LASER DIODE

BACKGROUND OF THE INVENTION

1. Field of the Invention

This invention relates to a power source control apparatus for controlling a current supply to a laser diode in a semiconductor laser. The semiconductor laser oscillates laser by supplying current to a p-n junction. Particularly, this invention is applicable to a solid state laser apparatus or the like that excites a solid state laser medium such as YAG laser rod by a laser beam so as to output a laser beam from the solid state laser medium.

2. Description of Related Art

Figure 12:
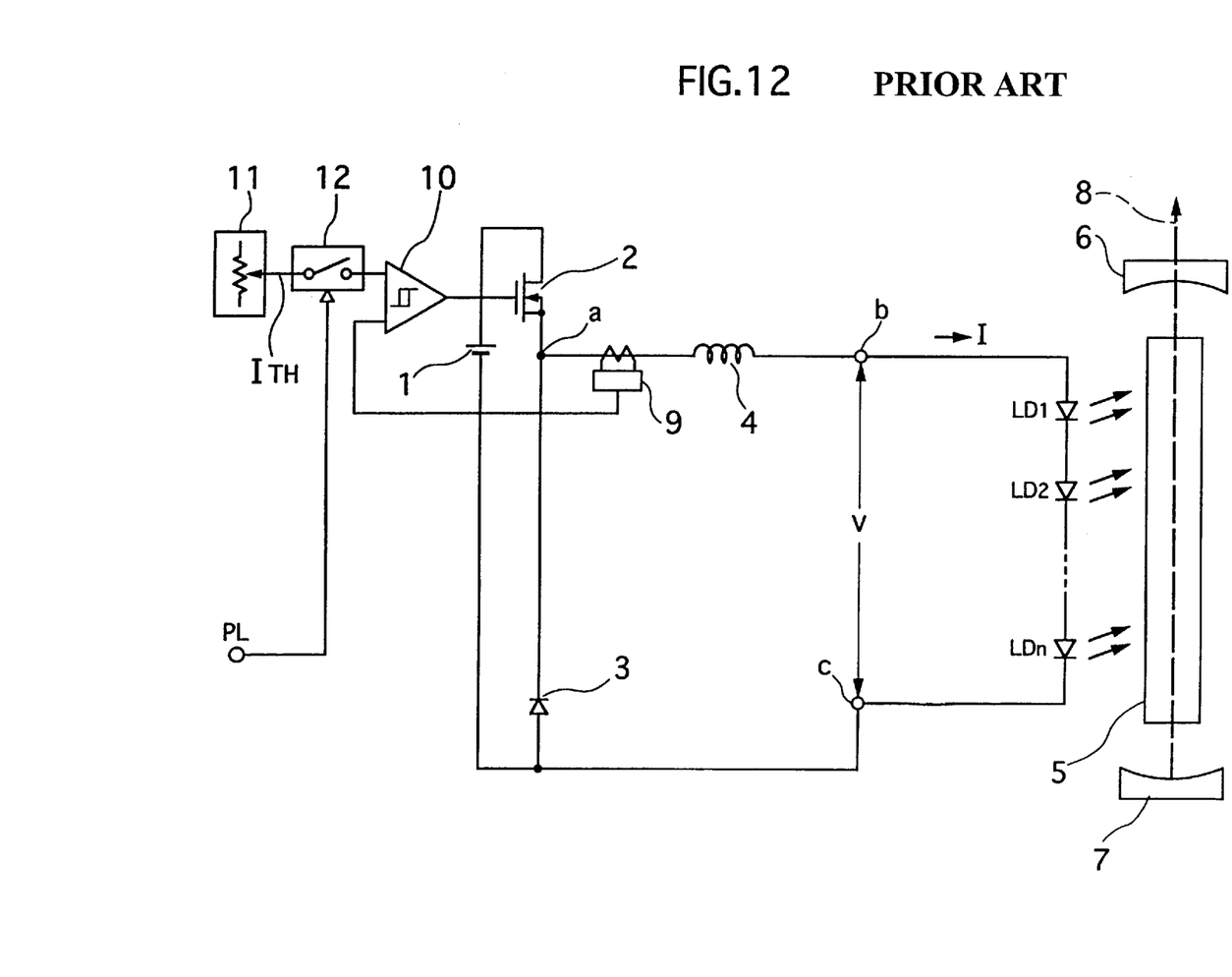
FIG. 12 is a circuit diagram showing an overall circuit of a conventional power source control apparatus for laser diodes.

FIG. 12 shows an overall circuit of a conventional power source control apparatus for laser diodes.

Referring to FIG. 12, a power source 1 is composed of a constant voltage source like a D.C. power source and so on. A current control switching element 2 is connected to the power source 1 so as to perform a switching operation by an external signal, i.e. an output command signal PL. The power source 1 is connected to a series circuit of the switching element 2 and a reverse-biased diode 3. A reactor 4 is connected to a junction point "a", where the switching element 2 and the diode 3 are connected in series with each other. The other terminal of the reactor 4 is connected at a junction point "b" to an anode side of laser diodes LD1–LDn, which are connected in series. On the other hand, a cathode side of the laser diodes LD1–LDn is connected at a junction point "c" to a junction point between the power source 1 and the diode 3. Power is supplied to the laser diodes LD1–LDn by switching control of the switching element 2 through the reactor 4.

The laser diodes LD1–LDn respectively emit laser beams to a solid state laser medium or rod 5. Such laser beams are excited and oscillated between a reflecting mirror 7 (100% reflectance) and a semi-transparent mirror 6, so that a laser beam 8 goes out from the semi-transparent mirror 6. In order to supply current to the laser diodes LD1–LDn, a current detector 9 detects a current of the reactor 4. Then, an output of the detector 9 is fed back to an error comparator 10 and compared with a command value ITH of a commander 11. The switching element 2 performs switching control according to a comparison result so as to feed a current of an equal value to the command value ITH. The command value signal ITH is turned on and off by an analog gate 12, which is operated by an output drive signal PL. Consequently, the current supplied to the laser diodes LD1–LDn is on off controlled so that a constant current set as the command value ITH is supplied to the laser diodes LD1–LDn.

Figure 13A:
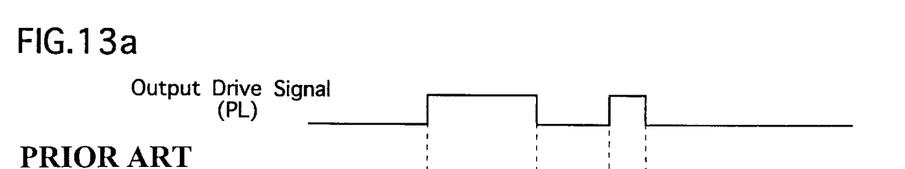
FIGS. 13a–13c show waveforms and a time chart explaining an operation of the control apparatus of FIG. 12.
Figure 13B:
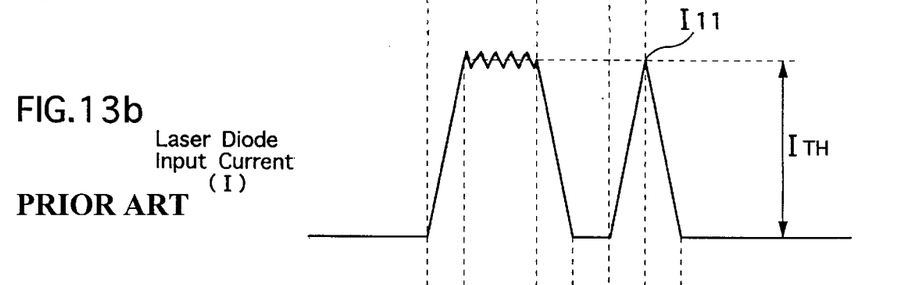
Figure 13C:
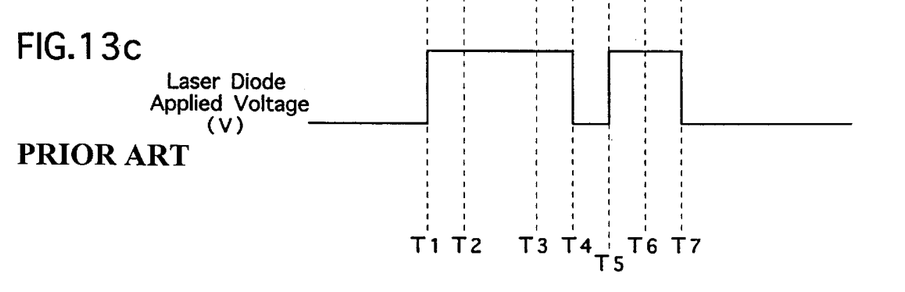

FIGS. 13a–13c show waveforms and a time chart explaining an operation of the control apparatus of FIG. 12.

FIG. 13a shows a waveform of the drive signal PL for turning on and off the analog gate 12. FIG. 13b shows a waveform of a laser diode input current I that is a current supplied to the laser diodes LD1–LDn. FIG. 13c is a waveform of a laser diode applied voltage V that is a voltage applied to the laser diodes LD1–LDn.

When the signal PL becomes on at timing T1, the switching element 2 turns on. Then, the current I increases at a fixed time constant by an inductance of the reactor 4. When the current I of the reactor 4 reaches the command value ITH at timing T2, the switching element 2 is on-off controlled to keep the current I at such constant value. At this time, the output of the detector 9 is input into the comparator 10 and compared with the command value ITH, so that the current of the same value as the command value ITH is supplied by the switching control. When the signal PL is switched off at timing T3, the switching element 2 turns off. Then, the current I of the reactor 4 begins decreasing at a fixed time constant. Since the reactor 4 stores energy, which is decided by the inductance and the current value, the current I is not turned off until timing T4. The inductance of the reactor 4 stores the energy between the timings T1 and T2 when the current I increases. Therefore, in case the inductance is large, it takes a long time. Especially, when a short width pulse is output between the timings T5–T6, the current I cannot be a rectangular wave as shown by the output current waveform I11 between the timings T5–T7.

Namely, the conventional control apparatus cannot supply an input current of rectangular wave to the laser diodes LD1–LDn in response to a short width pulse. Thus, the output current has a slow response speed, and it is impossible to output a correct pulse current waveform.

BRIEF SUMMARY OF THE INVENTION

An object of the present invention is to provide a power source control apparatus for a laser diode that has a rapid response in supplying current to a laser diode.

According to a first aspect of the invention, a power source control apparatus for a laser diode comprises a laser diode. A constant current source circuit supplies constant current to the laser diode. A switching element is connected in parallel between an anode and a cathode of the laser diode. A short circuit is provided to set a forward voltage drop of said switching element lower than a forward voltage drop of said laser diode. The short circuit turns the switching element on so as to short-circuit the anode and cathode of the laser diode when a laser output command signal for making the laser diode output a laser beam is off. The short circuit turns the switching element off so as to make the laser diode output the laser beam when the laser output command signal is on.

With such features, current change (di/dt) flowing in the reactor can be substantially ignored, so that influence due to inductance can be ignored, too. Thus, constant current pulses can be supplied with steep rise and fall. Consequently, the current supplied to the laser diode has a rapid response. Moreover, no reverse voltage is applied to the laser diode. Therefore, it is possible to provide a control apparatus that is little affected by power source voltage change.

The constant current source circuit may include a current controlling switching element and a diode connected in series. A d.c. power source is connected in parallel with the current controlling switching element and the diode. A reactor has one end connected to a junction point between the current controlling switching element and the diode. The d.c. current source and the other end of the reactor are connected to the laser diode. The current controlling switching element performs on-off control so that a current value of the reactor becomes equal to a command value, thereby supplying a predetermined current to one of the laser diode and short circuit. With such features, the reactor smoothes the current produced by the on-off signals of the current controlling switching element. Thus, the current has little ripple. Consequently, the circuit is easily configured at low costs.

The current controlling switching element may be turned on in advance when the laser output command signal is off so that said current value of said reactor becomes equal to said command value, thereafter turning said laser output command signal on. The current controlling switching element is turned off after the laser output command signal is turned off. With such features, the constant current supplied to the laser diode has its rise and fall very steep. It is possible to obtain constant current pulses with quick response to the laser output command signal. Consequently, laser is output from the laser diode at a correct timing.

One or both of a reverse-biased diode and a resistor may be connected in parallel with the laser diode at a position near the laser diode. With such features, the constant current supplied to the laser diode has very steep rise and fall. This prevents reverse voltage from being applied due to oscillating current generated by self-inductance of lead wires in the circuit, capacity of the switching element or laser diode, stray capacity between the lead wires and so on. Consequently, the circuit is very hard to be damaged.

Moreover, a plurality of laser diodes may be connected in series. Then, one or both of the diode and resistor is connected in parallel with each laser diode. The resistors have the same resistance. In this case, the resistors balance voltages between the laser diodes at an off time by dividing the voltages by the same resistance. Consequently, it is prevented that voltage concentrates on a certain laser diode. Moreover, the resistor acts to prevent oscillation of the oscillating current.

A power source voltage of the constant power source circuit may be approximately twice as large as a total value of the forward voltage drop of the laser diode. With such feature, the current increase and decrease of the reactor becomes substantially the same when turning on and off the current controlling switching element. Thus, an average of the current flowing through the current controlling switching element and laser diode becomes the same. Consequently, the current is averaged, and a high output power source can be fabricated at low costs as a whole.

A solid state laser medium may be excited by the laser beam output from the laser diode thereby to generate a laser beam. With such feature, the output current waveform is not affected by the d.c. current change. Thus, it is possible to supply sufficiently stable pulse current to the laser diode even if the voltage varies, even with the source voltage obtained by just rectifying a commercial a.c. current. Then, the output laser excites the solid state laser medium such as YAG laser rod thereby to oscillate the laser. Consequently, the laser beam can be output at high efficiency. Moreover, it is possible to produce the laser beam that is pulsed by the pulse current having rapid response. Such laser beam has good property for laser machining.

According to a second aspect of the invention, a power source control apparatus for a laser diode comprises a laser diode. A switching element is connected in parallel between an anode and a cathode of the laser diode. A driver circuit drives the laser diode. A cooler is made by assembling metal plates. The laser diode, switching element and driver circuit are mounted on said cooler.

With such features, easily heated electric parts can be mounted directly and compactly on the cooler. Otherwise, if a printed board is used, such electric parts can be mounted compactly on the cooler through the printed board. Therefore, it is possible to make constant thermal condition of the electric parts. Consequently, applied voltage does not change, and ON-OFF control can be performed with good response.

The cooler may define one electrode. The laser diode and switching element have one ends electrically and mechanically connected to the cooler. Another electrode is disposed between the laser diode and switching element. The other electrode is insulated from the cooler. The laser diode and switching element have another ends electrically connected to the other electrode. With such features, wiring length from the electrode to the laser diode and switching element becomes short. Thus, self-inductance value can be lessened.

A drive control circuit is disposed on the cooler to drive and control the switching element and laser diode. With such feature, a high power module can be small-sized and compact, thereby facilitating handling.

A cooling pipe may be provided to circulate cooling water therein. The cooling water flows in the cooling pipe so as to cool the cooler. With such feature, cooling efficiency is improved.

Further objects and advantages of the invention will be apparent from the following description, reference being had to the accompanying drawings, wherein preferred embodiments of the invention are clearly shown.

DETAILED DESCRIPTION OF THE INVENTION

Several embodiments of the invention are described hereunder referring to the attached drawings. The same reference character is attached to the same element as the conventional one shown in FIGS. 12 and 13a–13c. Moreover, the same reference character is used to show the same element throughout the several embodiments.

Figure 1:
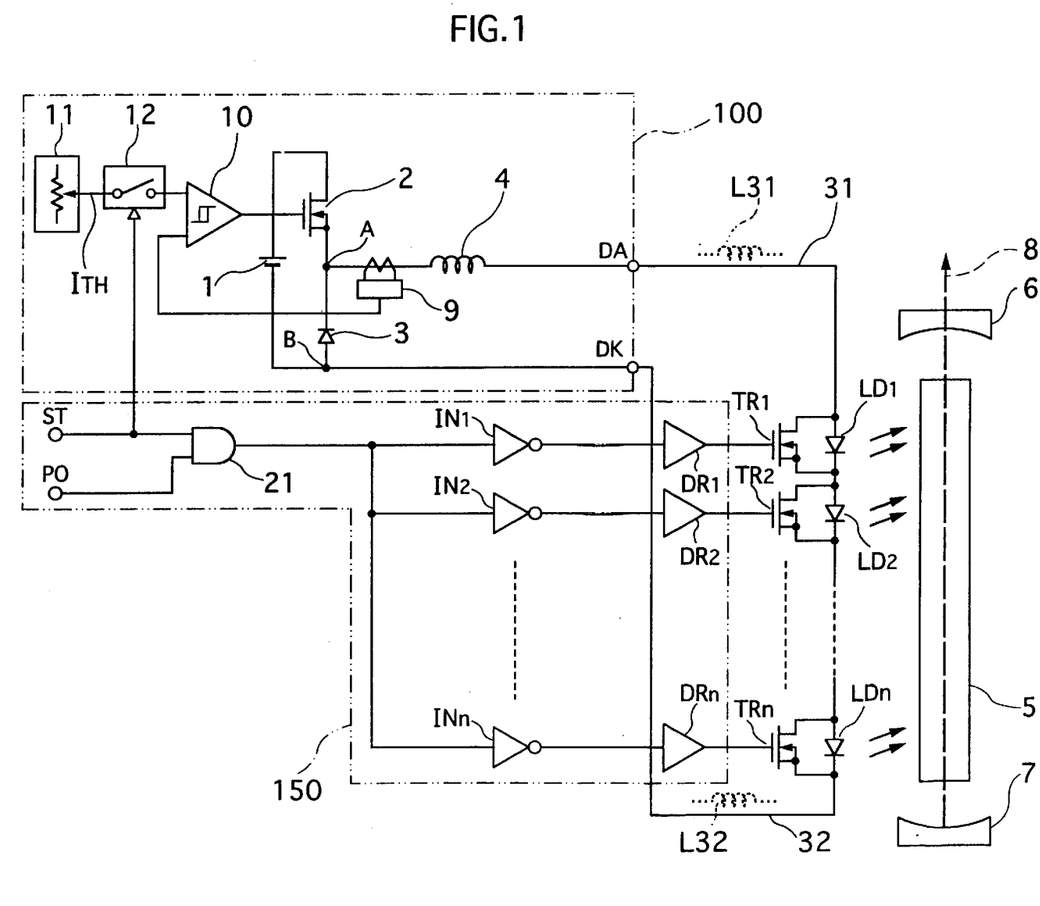
FIG. 1 is a circuit diagram showing an overall circuit of a power source control apparatus for laser diode according to a first embodiment of the invention.

FIG. 1 illustrates an overall circuit of a power source control apparatus for laser diode according to a first embodiment of the invention.

Referring to FIG. 1, the current controlling switching element 2 may be MOSFET, IGBT, SIT or other transistors. The switching element 2 is connected to a positive side of the power source 1 and performs a switching operation by an external drive signal ST mentioned later and an output of the current detector 9. The diode 3 acts as a flywheel for a below mentioned circuit which includes the reactor 4 and the laser diodes LD1~LDn and so on. It may have a single laser diode or plural laser diodes connected in series. A terminal of the reactor 4 is connected to a junction point A between the switching element 2 and the diode 3. The other terminal of the reactor 4 is connected to the anode side of the laser diodes LD1~LDn. An output terminal DA is defined by a junction point between the reactor 4 and the anode of the laser diodes LD1~LDn. The cathode side of the laser diodes LD1~LDn is connected to a junction point B between the power source 1 and the diode 3. An output terminal DK is defined by a junction point between the cathode of the laser diodes LD1~LDn and the junction point B. The output terminals DA and DK form output terminals of a constant current source circuit 100. The terminals DA and DK are connected to the laser diodes LD1~LDn by an anode side lead wire 31 and a cathode side lead wire 32, respectively.

Normally, self inductances L31 and L32 are produced on the lead wires 31 and 32 between the terminal DA and laser diodes LD1~LDn and between the terminal DK and laser diodes LD1~LDn, respectively.

A switching element TR1–TRn is connected between the anode and cathode of each of the laser diodes LD1, LD2–LDn. The switching element TR1–TRn turns on to short-circuit the respective laser diode LD1–LDn when it is on. The switching element TR1–TRn may be made of transistors such as MOSFET, IGBT and SIT. A resistance or a forward voltage drop of the switching element TR1–TRn is lower than 1.5–2.0V that is a forward voltage of the laser diodes LD1–LDn. Namely, in case the switching elements TR1–TRn turn on to short-circuit the corresponding laser diodes LD1–LDn, no current flows through the laser diodes LD1–LDn.

In order to supply current to the laser diodes LD1–LDn or switching elements TR1–TRn, the current detector 9 detects the current of the reactor 4. Then, the switching element 2 performs switching control on the basis of the output from the comparator 10, in a similar manner to the conventional art mentioned before. Thus, the supplied current has an equal value to the command value ITH. In the present embodiment, the analog gate 12 for turning on and off the command value signal ITH is operated by a drive signal ST. Namely, the analog gate 12 is on-off controlled by the drive signal ST which governs start and stop of the laser beam 8. Thus, the switching element 2 is on off controlled by the output from the comparator 10 to make the current of the reactor 4 equal to the command value ITH.

The constant current circuit 100 constitutes the above-mentioned circuit for controlling the current of the reactor 4 equal to the command value ITH. The circuit 100 has the terminal DA at the other end of the reactor 4 and the terminal DK at the cathode side of the power source 1. The circuit 100 is composed of the comparator 10, switching element 2, reactor 4 and detector 9. The output current thereof is supplied to the diodes LD1–LDn or switching elements TR1–TRn through the wires 31 and 32 from the terminals DA and DK.

Timing of the drive signal ST is calculated such that it rises at least before a rise of a laser output command signal PO and even before a rise of the output current from the power source 1 that is decided by the time constant of the reactor 4. The signal PO defines a signal for outputting the laser beam 8 from the laser diodes LD~LDn. Namely, drive signals ST may be generated successively by a repetitive pulse frequency of fixed pulse width when the power is switched on. Otherwise, a drive signal ST of fixed pulse width may rise before the rise of the signal PO by delaying the signal PO. Anyway, other modifications are possible as long as the reactor 4 is fed with a current of the command value ITH or its approximate value by the drive signal ST before the command signal PO or its rise. In addition, the drive signal ST must end after a fall of the command signal PO.

An AND circuit 21 generates a logical product of the command signal PO and the drive signal ST to drive the switching elements TR1–TRn through inverter circuits IN1–INn and driver circuits DR1–DRn. That is, when both of the signal ST and signal PO are generated, an output of the AND circuit 21 becomes "H". The output signal is inverted by the inverter circuits IN1–Inn and amplified by the driver circuits DR1–DRn. Thus, the switching elements TR1–TRn are turned off. When one of the signal ST and signal PO is not generated, the output of the AND circuit 21 becomes "L" and inverted by the inverter circuits IN1–Inn, so that the driver circuits DR1–DRn drives the switching elements TR1–TRn on.

The AND circuit 21, inverter circuits IN1–INn, driver circuits DR1–DRn form a signal processing circuit 150 of the present embodiment for controlling operations of the laser diodes LD1–LDn.

As mentioned above, when the switching elements TR1–TRn are turned off, the output current is supplied from the circuit 100 to the laser diodes LD1–LDn. On the other hand, when the switching elements TR1–TRn are turned on, the output current is supplied to the switching elements TR1–TRn. However, the current is not supplied to the laser diodes LD1–LDn. Thus, it is possible to switch the current flowing in the laser diodes LD1–LDn at high speed, though the current from the circuit 100 is constant.

The laser diodes LD1–LDn in themselves function in the same manner as the conventional art. It is preferable to decide the number of the laser diodes LD1–LDn depending on a desired laser output. Though described in detail referring to FIG. 3, reverse-biased diodes D1–Dn and resistors R1–Rn may be connected in parallel with the laser diodes LD1–LDn, respectively. Otherwise, one of the reverse-biased diode D1–Dn and resistor R1–Rn may be connected in parallel with each of the laser diode LD1–LDn. Such reverse diodes D1–Dn and resistors R1–Rn serve as a flywheel. Therefore, the diode D1–Dn or the resistor R1–Rn can be used alone depending on a quantity of back electromotive force.

FIGS. 2a–2e show a time chart and waveforms to explain an operation of the control apparatus according to the first embodiment of the invention.

Figure 2A:
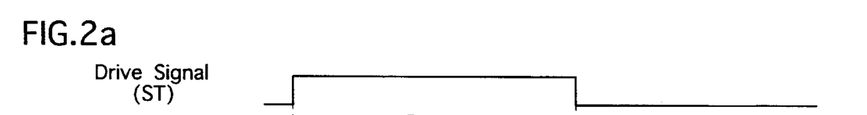
FIGS. 2a–2e show a time chart and waveforms to explain an operation of the control apparatus according to the first embodiment of the invention.
Figure 2B:
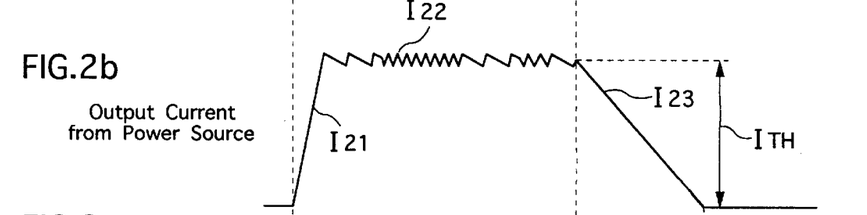
Figure 2C:
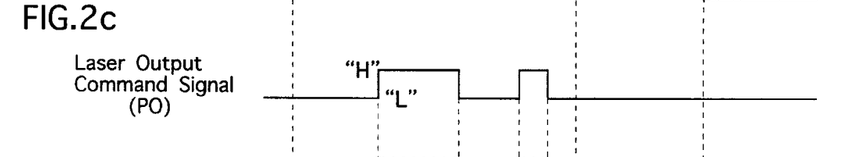
Figure 2D:
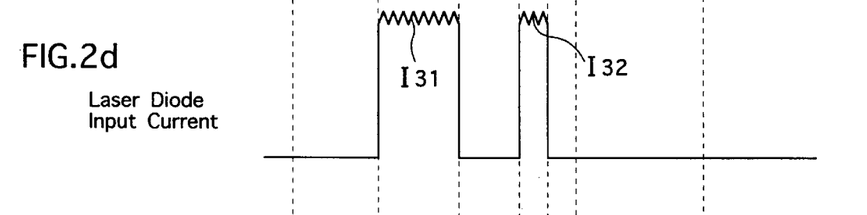
Figure 2E:
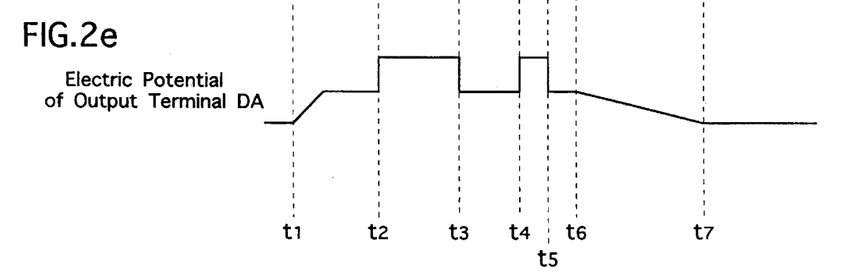

FIG. 2a shows a waveform of the drive signal ST. FIG. 2b shows a waveform of an output current from the power source. FIG. 2c shows a waveform of the command signal PO. FIG. 2d shows a waveform of a current supplied to the laser diodes LD1–LDn. FIG. 2e shows a waveform of an electric potential of the negative side of the power source and the terminal DA.

The drive signal ST shown in FIG. 2a turns on ("H") at timing t1 and off ("L") at timing t6. When there is no laser output, the command signal PO is off ("L") at timing t1 as shown in FIG. 2c. Thus, the output of the AND circuit 21 is "L" and the switching elements TR1–TRn are on. Since the switching elements TR1–TRn are on, the current from the circuit 100 flows through the switching elements TR1–TRn. At this time, no current flows through the laser diodes LD1–LDn, which have larger forward voltage drop.

When the drive signal ST becomes "H", the analog gate 12 switches on. Then, the switching element 2 turns on through the comparator 10. Thereby, the current increases at the time constant of the reactor 4, as shown by a rising waveform I21 of the output current from the power source 1 in FIG. 2b. When the current value reaches the command value ITH, the switching element 2 begins repeating on and off to keep the current at the fixed command value ITH, as shown by the waveform I22. At this time, the fixed level current keeps flowing through the switching elements TR1–TRn. No current flows through the laser diodes LD1–LDn until the command signal PO becomes "H".

The voltage of the terminal DA is only the voltage drop of the switching elements TR1–TRn. As shown in FIG. 2e, the voltage drop is proportional to the rising waveform I21 and the following command value ITH.

When the signal PO becomes "H" at the timing T2 as shown in FIG. 2c, the switching elements TR1–TRn turn off and no current flows therethrough. Then, the current flows through the laser diodes LD1–LDn. At this time, even though the current flow is switched from the switching elements TR1–TRn to the laser diodes LD1–LDn at high speed, the current value applied from the current circuit 1 is constant. A current switching speed is decided by a turn off time of the switching elements TR1–TRn. The change of the current flowing through the reactor 4 (di/dt) does not exist or can be substantially ignored, so that the inductance of the reactor 4 has no influence. Therefore, as shown by the laser diode input current waveform I31 in FIG. 2d, the current rises very quickly. Particularly, there is no influence of the self-inductance L31, L32 of the lead wire 31, 32. At this time, the voltage of the terminal DA is nearly the same as the forward voltage drop of the laser diodes LD1–LDn and higher than the forward voltage drop of the switching elements TR1–TRn. During this current switching, only a positive voltage is applied to the laser diodes LD1–LDn, and no negative voltage is applied thereto. Therefore, it is possible to drive safely and quickly the laser diodes LD1–LDn, which is sensitive to the negative voltage and possibly damaged thereby.

When the signal PO turns to "L" at the timing t3, the switching elements TR1–TRn are switched on. Then, the current from the circuit 100 is supplied to the switching elements TR1–TRn, while stopping flowing through the laser diodes LD1–LDn. At that time, the current flow can be changed from the laser diodes LD1–LDn to the switching elements TR1–TRn at high speed so that the current is kept constant. A switching speed at that time is decided by a turn on time of the switching elements TR1–TRn. Then, the voltage of the terminal DA becomes the forward voltage drop of the switching elements TR1–TRn. During this current switching, only a positive voltage is applied to the laser diodes LD1–LDn, so that they are driven safely and quickly.

As mentioned above, there is no current change in the reactor 4 in switching the current between the laser diodes LD1–LDn and the switching elements TR1–TRn. Therefore, the inductance of the reactor 4 has no influence, so that the current rise and fall is very quick as shown in FIG. 2d. Thus, even if the signal PO has short width between timing t4 and timing t5, a correct pulse current can be supplied to the laser diodes LD1–LDn.

If the signal ST becomes off at timing t6, the switching element 2 turns off. Then, the current of the reactor 4 circulates the reactor 4, switching elements TR1–TRn and diode 3, thereby decreasing little by little, as shown by a waveform I23 in FIG. 2b. The decreasing current of the reactor 4 has no influence on the laser diodes LD1–LDn.

The switching element TR1–TRn defines a short circuit of the present embodiment, which short-circuits the laser diode LD1–LDn when there is no signal PO, while driving the laser diodes LD1–LDn when there is a signal PO.

As described above, the control apparatus of the present embodiment basically operates as follows. First, it switches the signal ST to "H" and switches on and off the signal PO after the current of the reactor 4 reaches the command value ITH. Then, it switches the signal ST to "L" after switching off the signal PO. Therefore, the laser diodes LD1–LDn can be always supplied with an input current that rises and falls quickly and has a peak value equal to the command value ITH as a pulse signal. Moreover, even if the terminals DA, DK are distant from the laser diodes LD1–LDn, there are no influence of the self-inductance L31 and L32 of the lead wires 31 and 32, and quick current response is obtained. Therefore, the control apparatus of the present embodiment is effective even to a laser oscillator of large power, namely, in case the distance between the terminals DA and DK and the laser diodes LD1–LDn is long and the input current of the laser diodes LD1–LDn is large. Moreover, the control apparatus is hard to the influence of the power source voltage change, while having high responsibility in supplying current to the laser diodes LD1–LDn. Furthermore, since constant current pulses of quick response are obtainable in response to the command signal PO, intended correct laser output can be got from the laser diodes LD1–LDn. In addition, the reactor 4 smoothes the constant current produced by the switching element 2, so that the constant current has little ripple. Consequently, the constant power source circuit of the present embodiment is simple and less expensive compared with a conventional constant power source circuit for controlling current to a constant level.

Figure 3:
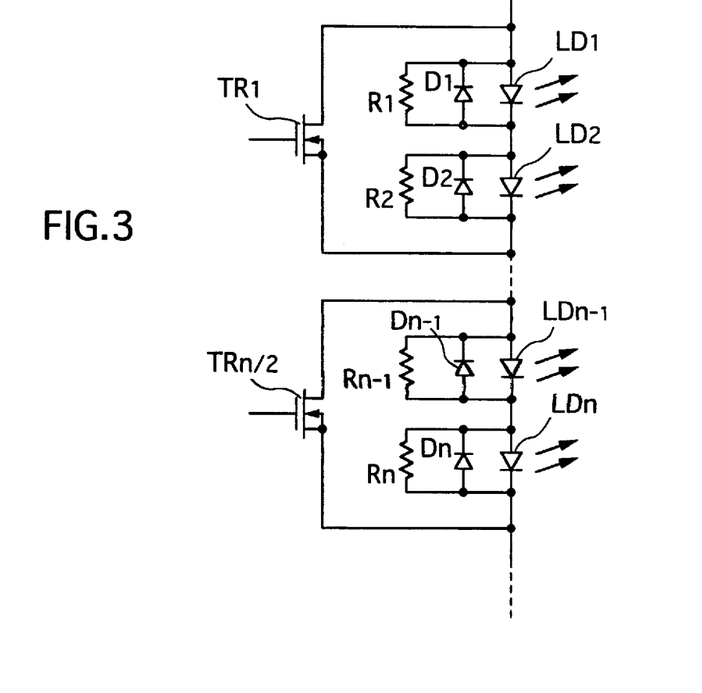
FIG. 3 is a circuit diagram showing a main circuit at a laser diode side of a power source control apparatus for laser diodes according to a second embodiment of the invention.
Figure 4:
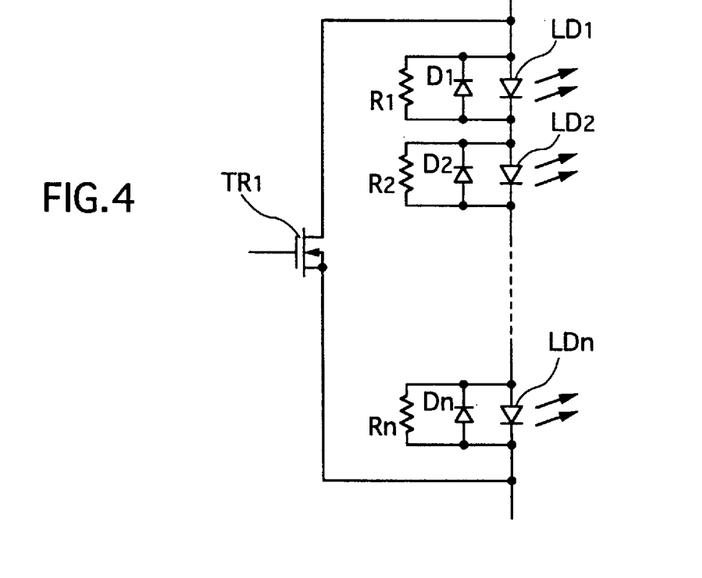
FIG. 4 is a circuit diagram showing a main circuit at a laser diode side of a power source control apparatus for laser diodes according to a third embodiment of the invention.

FIG. 3 shows a circuit diagram of a main circuit at a laser diode side of a power source control apparatus for laser diodes according to a second embodiment of the invention. In this embodiment, switching elements are provided half as many as the laser diodes LD1–LDn. On the other hand, FIG. 4 shows a circuit diagram of a main circuit at a laser diode side of a power source control apparatus for laser diodes according to a third embodiment of the invention. In this embodiment, a single switching element is provided for the laser diodes LD1–LDn.

While the switching element is connected to each of the laser diodes in the first embodiment, the number of the switching elements may be reduced. Namely, one switching element may be connected in parallel with two or more laser diodes. In such case, plural laser diodes are short-circuited or driven together in accordance with the on or off of a corresponding switching element. FIGS. 3 and 4 show such modifications. Referring to FIG. 3, one switching element TR1–TRn/2 is connected in parallel with two laser diodes LD1–LDn. In FIG. 4, one switching element TR1 is connected in parallel with all the laser diodes LD1–LDn. In the embodiment of FIG. 4, the plural laser diodes LD1–LDn can be short-circuited by the least number of switching element TR1, so that the circuit can be constructed cheaply.

Moreover, especially where plural laser diodes LD1–LDn are connected in series, a voltage of a junction point becomes sometimes unstable if a reverse voltage is applied. Therefore, in either embodiment, a diode D1–Dn as a reverse voltage preventing diode and a resistor R1–Rn are parallel connected in a pair to each of the laser diodes LD1–LDn. The diode D1–Dn is preferably one which has low forward voltage and which can perform high speed switching, such as a Schottky barrier diode. The resistor R1–Rn is preferably one which has a low resistance less than about 100 Ω. Even if such resistor R1–Rn of low resistance is used, the forward voltage of the laser diode LD1–LDn is about 2V, so that power consumption is little and can be ignored.

In the second and third embodiments, the output current from the control apparatus rises and falls very quickly. Consequently, it is possible that an oscillating current be generated due to a capacity of the laser diodes LD1–LDn or stray capacity of the wiring or the like. Therefore, the diode D1–Dn is connected reversely to each laser diode LD1–LDn. Thus, the laser diodes LD1–LDn are prevented from reverse voltage and protected from damage. The resistors R1–Rn have the same resistance value and balance the voltage among the laser diodes LD1–LDn, thereby preventing voltage concentration to a certain laser diode LD1–LDn. When the current flows through the laser diodes LD1–LDn, even if a resistor of low resistance is used, the power consumption is so small to the laser diode that it can be ignored. Moreover, it acts to prevent oscillation of the oscillating current. Of course, the same effects are produced if both the diodes D1–Dn and resistors R1–Rn are connected. However, the laser diode LD1–LDn and switching element TR1–TRn are connected in parallel and operated vise versa in the invention. Therefore, there is no problem since no reverse bias is applied to them in a normal use, even if one of the diode D1–Dn and resistor R1–Rn is used. Furthermore, even if neither of the diode D1–Dn and resistor R1–Rn is used, the same effects are obtained.

If the voltage of the power source 1 is higher relative to the forward voltage of the laser diodes LD1–LDn connected in series, the rising speed becomes faster. However, such voltage has nothing to do with the falling speed. On the other hand, an excessively high voltage of the power source 1 is not preferred because it increases switching loss of the switching element 2 and noise. It is preferable to set the voltage of the power source 1 nearly twice as large as that of the total forward voltage drop of the laser diodes LD1–LDn. In this case, the current increase and decrease of the reactor 4 become the same when the switching element 2 turns on and off. Thus, an average current flowing through the switching element 2 and diode 3 becomes the same, so that the current becomes uniform. Therefore, it is possible to construct the power source 1 with a high output power at low cost. The source voltage is not required to be exactly "twice" as large as the total forward voltage drop of the laser diodes LD1–LDn. It was confirmed by the inventors and so on that there was generated no bad influence if the source voltage was about 1.5–3 times as large.

As mentioned above, the control apparatus according to each embodiment has an optimum d.c. voltage. However, the change of the d.c. voltage does not affect the output current waveform. Thus, even if a voltage obtained just by rectifying the commercial a.c. voltage is used, a sufficiently stable pulse current can be supplied to the laser diodes LD1–LDn regardless of the change of the voltage. Moreover, the laser diodes LD1–LDn is supplied with current by the control apparatus supplies, thereby to output laser. Such laser excites the solid state laser medium or YAG laser rod. Then, the laser is oscillated between the opposed mirrors 6 and 7, so that the laser beam 8 can be output with high efficiency. The excitation of the YAG laser with the laser diodes LD1–LDn is very effective. Moreover, it is possible to obtain the pulsed laser beam 8 by the pulse current of quick response as the output current from the control apparatus.

Figure 5:
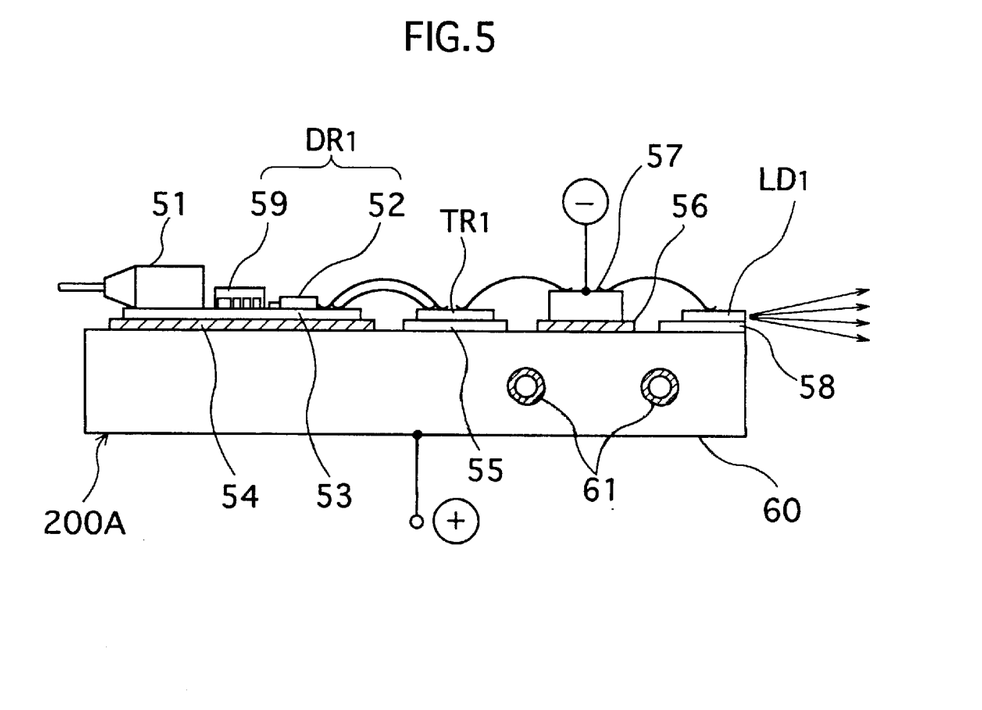
FIG. 5 is a side view showing a laser diode module that has electric parts mounted for use in a power source control apparatus according to a fourth embodiment of the invention.
Figure 6:
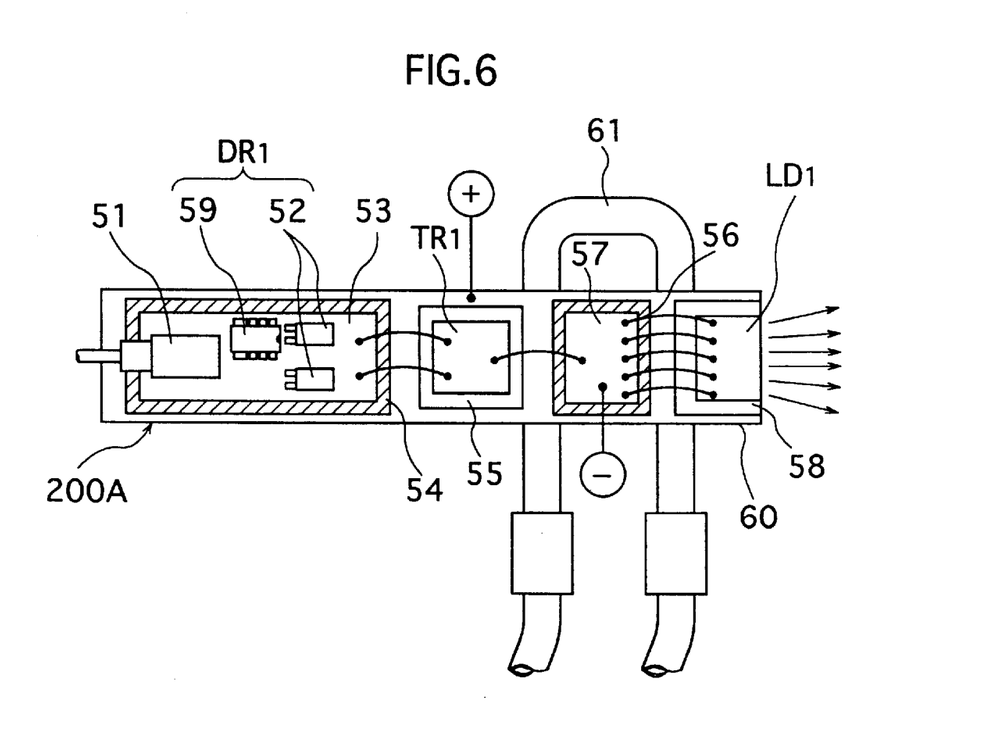
FIG. 6 is a plan view showing the laser diode module of FIG. 5.

FIG. 5 shows a side view of a laser diode module that has electric parts mounted for use in a power source control apparatus according to a fourth embodiment of the invention. FIG. 6 shows a plan view of the laser diode module of FIG. 5.

Referring to FIG. 5, a signal connector 51 is electric connecting means for inputting an output of the AND circuit 21 and the inverter circuit IN1 from the constant current circuit 100. An amplifier circuit 59 and transistors 52 of a driver circuit DR1 amplify the output of the inverter circuit IN1. Then, the amplified output is output to the switching element TR1. The module is applied to the case in which one switching element TR1 is used for one laser diode LD1 as shown in FIG. 1. Of course, the module is applicable to the other pair of switching element TR2–TRn and laser diode LD2–LDn in the same way. The connector 51 and the driver circuit DR1, which is easy to heat, are mounted on a printed board 53. The printed board 53 is made of a thermal conductor and joined and fixed to a cooler 60 via an insulator base 54, such as an adhesive or the like, which is an electric insulator. The switching element TR1 is fixed on the cooler 60 through an adhesive 55 or solder so that its drain is electrically connected to the cooler 60. A source of the switching element TR1 is connected to an electrode 57 that is secured on the cooler 60 through an insulator base 56. A gate of the switching element TR1 is connected to the transistors 52 through the printed board 53.

The cooler 60 is composed of a housing made by assembling metallic plates. A cooling pipe 61 is connected or goes through the cooler 60 so as to circulate cooling water. Thus, the cooling water supplied into the cooling pipe 61 cools the overall cooler 60. The cooler 60 is connected to the output terminal DA of the circuit 100, so that the cooler 60 is given a positive electric potential by the circuit 100. Moreover, the drain of the switching element TR1 is electrically and mechanically connected to such cooler 60. On the other hand, the source of the switching element TR1 is connected to the electrode 57 at the negative electrode side or the output terminal DK, while electrically disconnected from the cooler 60 through the insulator 56. The anode of the laser diode LD1 is fixed on the cooler 60 through an adhesive 58 or solder so as to be electrically connected to the cooler 60. On the other hand, the cathode of the laser diode LD1 is connected to the electrode 57.

The drive circuit DR1 forms a part of the signal processing circuit 150, which drives and controls the laser diode LD1, in the present embodiment.

In the above embodiment, the laser diode LD1, switching element TR1 and driver circuit DR1 are mounted on the cooler 60. Namely, the electric parts that are easy to heat may be assembled directly and compactly on the cooler 60. Otherwise, they may be mounted compactly on the cooler 60 via the printed board 53. Therefore, thermal condition of such parts is constant, so that ON-OFF control is performed without any applied voltage change and with high responsibility.

A laser diode module 200A is made by mounting the laser diode LD1 and switching element TR1 on the same cooler 60. In the module 200A, the current flows by a voltage between the electrode 57 as the negative electrode and the cooler 60 as the positive electrode. Thus, it is possible to make compact the configuration from the signal connector 51 to the drive control circuit, namely the switching element TR1 and laser diode LD1.

In this embodiment, one ends of the laser diode LD1 and switching element TR1 are electrically and mechanically connected to the cooler 60 as a positive electrode. The electrode 57, which is insulated from the cooler 60, is disposed between them. Then, the other ends of the laser diode LD1 and switching element TR1 are connected to the electrode 57. Therefore, the wire length between the electrode 57, laser diode LD1 and switching element TR1 becomes short, thereby decreasing the self-inductance.

Figure 7:
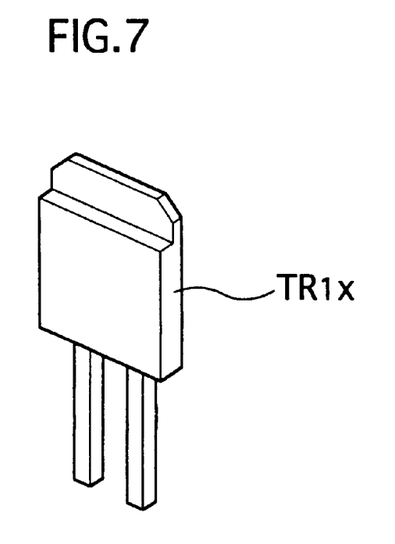
FIG. 7 is a perspective view showing a specific switching element used in a power source control apparatus according to a fifth embodiment of the invention.
Figure 8:
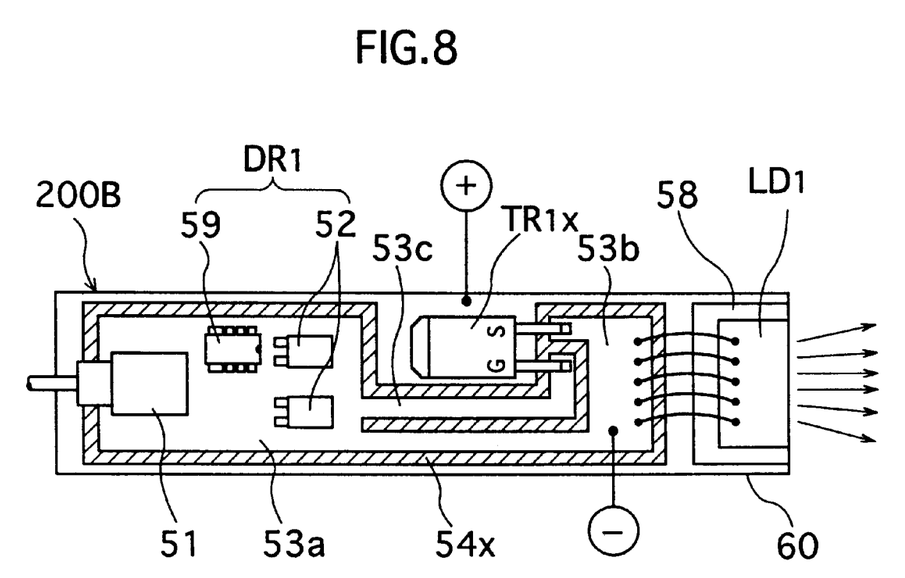
FIG. 8 is a plan view showing a laser diode module that has electric parts mounted thereon for use in the power source control apparatus according to the fifth embodiment of the invention.

FIG. 7 shows a specific switching element used in a power source control apparatus according to a fifth embodiment of the invention. FIG. 8 shows a plan view of a laser diode module that has electric parts mounted thereon for use in the power source control apparatus according to the fifth embodiment of the invention.

Referring to FIGS. 7 and 8, a specific switching element TR1x is used, while a shape of a printed board is modified in the fifth embodiment. While the fourth embodiment has two printed boards 54 and 57, the fifth embodiment has a single printed board. In detail, the printed board of the fifth embodiment is composed of a first printed portion 53a, second printed portion 53b and third printed portion 53c. The first printed portion 53a is arranged at a left side of the cooler 60 and supports the connector 51, amplifier circuit 59 and transistors 52 thereon. The second printed portion 53b extends from the first printed portion 53a and has a major part thereof disposed at a right side of the cooler 60, next to the laser diode LD1. The third printed portion 53c extends from the first printed portion 53a to the major part of the second printed portion 53b. An insulator base 54x of the fifth embodiment is interposed entirely between the printed board 53a–53c and the cooler 60 so as to electrically insulating them. Thus, there is remained an area where the cooler 60 is exposed.

The switching element TR1x has a housing mechanically secured to such exposed area of the cooler 60 by soldering. Thus, a drain of the switching element TR1x is electrically connected to the cooler 60. A gate of the switching element TR1x is electrically connected to the transistors 52 via a conductive pattern formed on the third printed portion 53c. A source of the switching element TR1x is electrically connected to the second printed portion 53b. The cathode of the laser diode LD1 is electrically connected to a conductive pattern of second printed portion 53b by wire bonding or the like. The anode of the laser diode LD1 is fixed on the cooler 60 so as to be electrically connected therewith via an adhesive 58 or solder or the like. Thus, the drain of the switching element TR1x and the anode of the laser diode LD1 are electrically connected with the positive electrode, while the source of the switching element TR1x and the cathode of the laser diode LD1 is electrically connected with the negative electrode.

In this embodiment, the laser diode LD1 and the switching element TR1x are mechanically joined to the cooler 60, too, so that their anodes are electrically connected with each other via the cooler 60. Consequently, the wire length between the laser diode LD1 and the switching element TR1 becomes short, thereby decreasing the self-inductance.

Moreover, the laser diode LD1, switching element TR1x and driver circuit DR1 are mounted on the cooler 60 as in the fourth embodiment. Therefore, the same advantageous effects are obtained.

Furthermore, a laser diode module 200B of the fifth embodiment has a simple wiring as a whole, so that its manufacturing costs are lowered.

Figure 9:
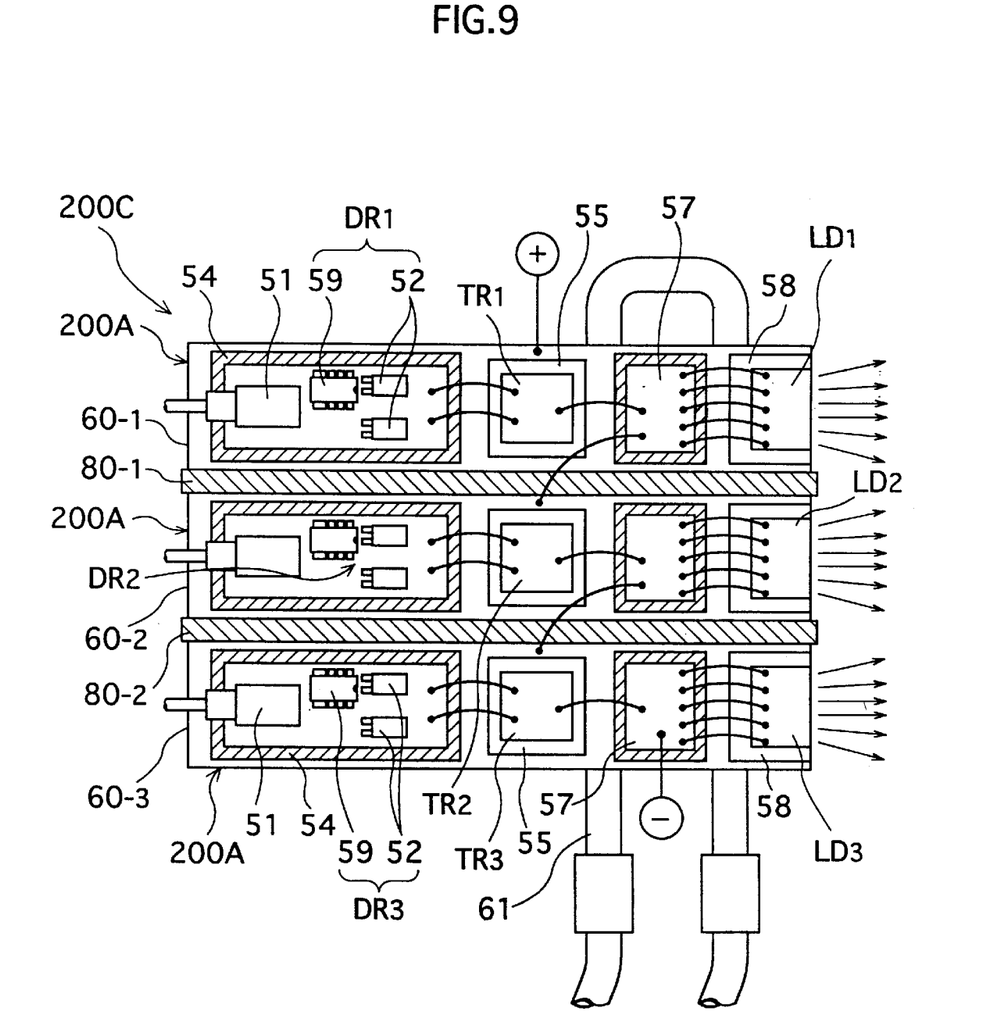
FIG. 9 is a plan view showing a laser diode module that has electric parts mounted thereon for use in the power source control apparatus according to the sixth embodiment of the invention.

FIG. 9 shows a plan view of a laser diode module that has electric parts mounted thereon for use in the power source control apparatus according to the sixth embodiment of the invention.

The sixth embodiment uses three laser diode modules 200A shown in FIG. 4. Three coolers 60-1, 60-2 and 60-3 of the same configuration as the cooler 60 are joined and fixed with each other by insulator bases 80-1 and 80-2. The insulator base 80-1, 80-2 is made of a synthetic resin, synthetic rubber or the like. The cooler 60-1 is electrically connected to the positive electrode. The electrode 57 mounted on the cooler 60-1 is electrically connected to the cooler 60-2 of the next module 200A by wiring. Similarly, the electrode 57 mounted on the cooler 60-2 is electrically connected to the cooler 60-3. The electrode 57 mounted on the cooler 60-3 is electrically connected to the negative electrode. Thus, the three modules 200A is made into one body to define a laser diode module 200C of the present embodiment. Three laser diodes LD1, LD2 and LD3 are provided in the sixth embodiment, while the single laser diode LD1 is used in the fourth or fifth embodiment. Consequently, the output of the laser diodes LD1–LD3 is three times as large as the output of the single laser diode LD1. While the module 200C of the present embodiment uses three modules 200A of FIG. 4, it may be modified to use two or more modules 200A as desired. According to the present embodiment, standardization is possible. Moreover, a large laser output power is obtainable as desired with a compact structure. The cooling pipe 61 is electrically insulated from the coolers 60. A periphery of the cooling pipe 61 may be surrounded by an insulating material. Otherwise, the cooling pipe 61 itself may be made of insulating material. Thus, the coolers 60 are electrically insulated with each other.

In the sixth embodiment, the three laser diodes LD1–LD3 are electrically connected in series. Accordingly, three switching elements TR1–TR3 are electrically connected between the anodes and cathodes of the laser diodes LD1–LD3, respectively. Moreover, three driver circuits DR1–DR3 of the same configuration drive the laser diodes LD1–LD3, respectively. Such laser diodes LD1–LD3, switching elements TR1–TR3 and driver circuits DR1–DR3 are mounted on the cooler 60 as in the fourth embodiment. Therefore, the same advantageous effects are obtained.

Moreover, the wire length between the laser diode LD1–LD3 and the switching element TR1–TR3 becomes short, thereby decreasing the self-inductance.

Figure 10:
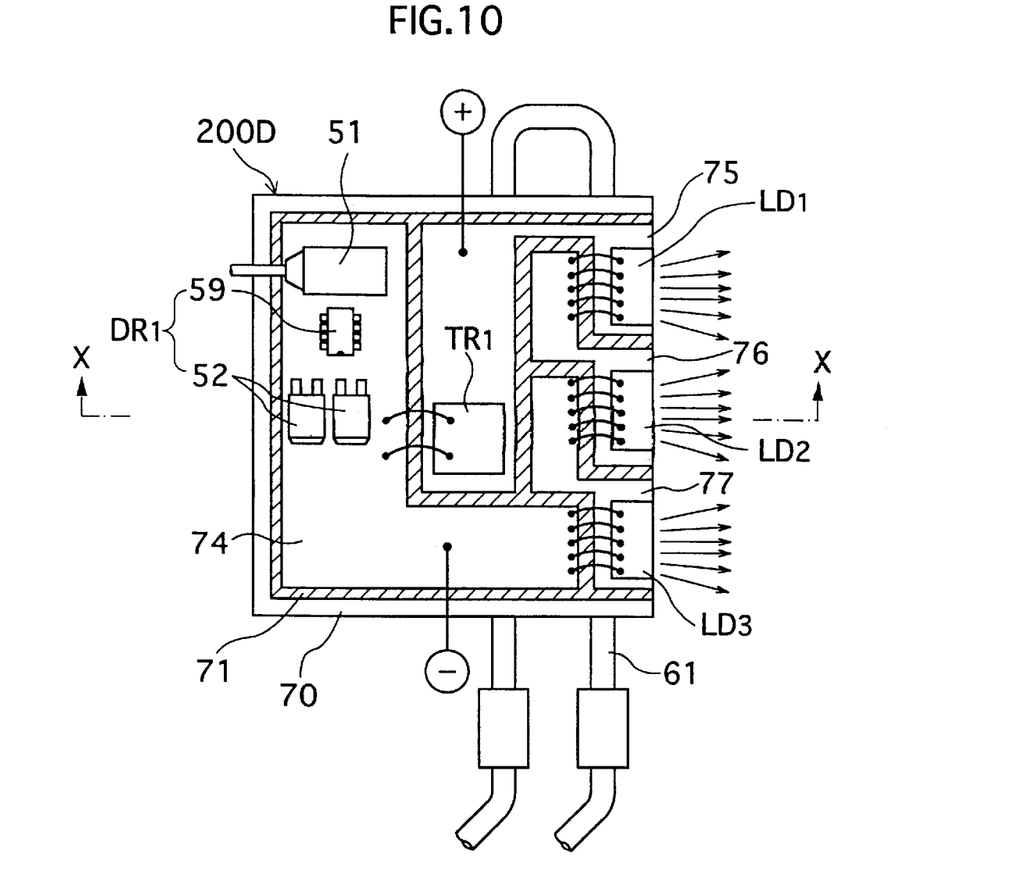
FIG. 10 is a plan view showing a laser diode module that has electric parts mounted for use in a power source control apparatus according to a seventh embodiment of the invention.
Figure 11:
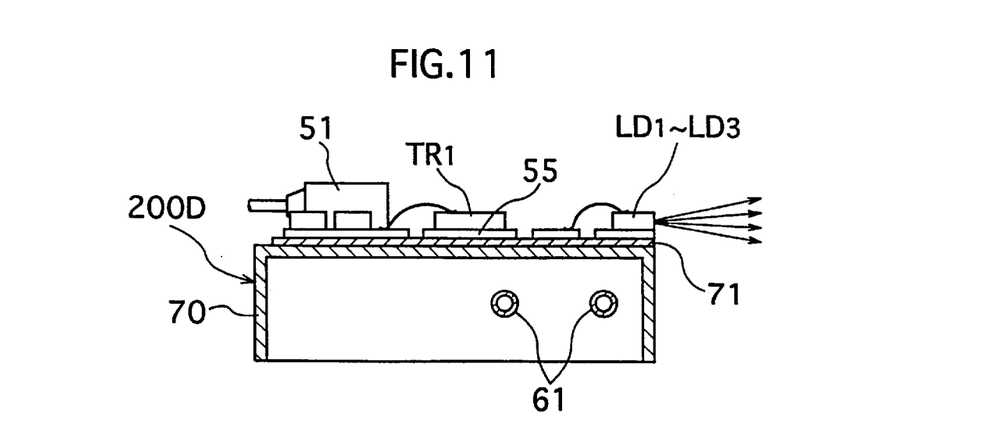
FIG. 11 is a cross-sectional view taken along the line X—X of FIG. 10.

FIG. 10 shows a plan view of a laser diode module that has electric parts mounted for use in a power source control apparatus according to a seventh embodiment of the invention. FIG. 11 shows a cross-sectional view taken along the line X—X of FIG. 10.

Referring to FIG. 10, the single switching element TR1 is used to short-circuit the three laser diodes LD1–LD3. In detail, four printed boards 74, 75, 76 and 77 are mounted on a cooler 70, while electrically insulated from the cooler 70 and with each other by an insulator base 71. The printed board 75 is electrically connected to the positive electrode, while the printed board 74 is electrically connected to the negative electrode. The signal connector 51 and the driver circuit DR1 are mounted on the printed board 74. The drain of the switching element TR1 (TRn) is thermally connected to the cooler 70. For example, the drain is mechanically coupled to the cooler 70 by soldering so as to conduct heat to the cooler 70. Moreover, the drain is electrically connected to the positive electrode via a conductive pattern of the printed board 75. The source of the switching element TR1 is electrically connected to the negative electrode through a bonding wire and a conductive pattern of the printed board 74. The gate of the switching element TR1 is electrically connected to the transistors 52 through a conductive pattern of the printed board 74. The laser diode LD1 is mounted on the cooler 70 through the printed board 75. The laser diode LD2 is mounted on the cooler 70 through the printed board 76. The laser diode LD3 is mounted on the cooler 70 through the printed board 77. The printed board 75, 76, 77 has high heat conductivity so that the laser diode LD1, LD2, LD3 is thermally coupled to the cooler 70. The anode of the laser diode LD1 is electrically connected to the positive electrode through a conductive pattern of the printed board 75. The cathode of the laser diode LD1 is electrically connected to the anode of the laser diode LD2 through wires and conductive patterns of the printed board 76. The cathode of the laser diode LD2 is electrically connected to the anode of the laser diode LD3 through wires and conductive patterns of the printed board 77. The cathode of the laser diode LD3 is electrically connected to the negative electrode through wires and conductive patterns of the printed board 74. The cooling pipe 61 goes through the cooler 70. Contrary to the sixth embodiment, no insulating material covers the cooling pipe 61 in this embodiment. The cooling pipe 61 is directly coupled to the cooler 70 so as to improve heat conductivity. While a laser diode module 200D uses three laser diodes LD1–LD3 in this embodiment, it may be modified to use two or more laser diodes as desired.

As mentioned above, the laser diode module 200D mounts the laser diodes LD1–LD3, amplifier circuit 59, transistors 52 and switching element TR1 on the cooler 70 which is cooled by the cooling pipe 61. Therefore, the cooler 70 can effectively absorb the heat generated from these electric parts. Moreover, since such electric parts are mounted on the conductive patterns of the printed boards 74–77, the wiring is very simple and the module can be fabricated at low costs. Furthermore, it is possible to get a laser beam of large output power from the plural laser diodes LD1–LD3 as desired.

In addition, one electrode of the laser diodes LD1–LDn and switching element TR1 is soldered directly to each corresponding conductive pattern of the printed board 74, 75, 76, 77. Moreover, the other electrode is wired to the adjacent conductive pattern by wire bonding or the like. Therefore, the wire length between the laser diodes LD1–LD3 and the switching element TR1 becomes short, thereby decreasing the self-inductance.

In the present embodiment, the switching element TR1 is electrically connected between the anode and cathode of the laser diodes LD–LD3. The driver circuit DR1 drives the laser diodes LD1–LD3. The cooler 70 is made by assembling metal plates. Then, the laser diodes LD1–LD3, switching element TR1 and driver circuit DR1 are mounted on such cooler 70 as in the fourth embodiment. Therefore, the same advantageous effects are obtained.

The switching element TR1–TRn and laser diode LD1–LDn are driven and controlled by the drive circuit DR1 as drive control circuit that is mounted on the cooler 60, 70. Therefore, they can be small-sized and compact, thereby facilitating their handling.

While plural laser diodes are preferably used in the first to seventh embodiments, the number of the laser diode depends on a required output of the laser beam 8. Namely, the number may be only one or plural as desired.

While the constant current source 100 uses the switching element 2 for current control that performs switching control to supply constant current to the laser diodes LD1–LDn, any constant current source may be used. The circuit to obtain the constant current is not limited to a specific configuration as shown in the above embodiments.

The laser diode in each embodiment produces laser by semiconductor in the form of integrated diodes. However, the laser diode of the invention may be selected from any semiconductors producing laser and contains any semiconductors in its definition as a matter of course.

The preferred embodiments described herein are illustrative and not restrictive, the scope of the invention being indicated in the appended claims and all variations which come within the meaning of the claims are intended to be embraced therein.

What is claimed is:

1. A power source control apparatus for a laser diode, comprising:

a laser diode having an anode and a cathode;

a switching element connected in parallel between said anode and said cathode of said laser diode, said switching element having a forward voltage drop lower than a forward voltage drop of said laser diode;

a shorting circuit that turns said switching element on so as to short-circuit said anode and cathode of said laser diode when said shorting circuit receives no laser output command signal for making said laser diode output a laser beam, said shorting circuit turning said switching element off so as to make said laser diode output the laser beam when said shorting circuit receives said laser output command signal; and, a constant current source circuit that supplies current to the laser diode, the current being switched to one of said laser diode and said switching element by said shorting circuit.

2. A power source control apparatus according to claim 1, in which said constant current source circuit comprises:

a current controlling switching element and a diode connected in series;

a d.c. power source connected in parallel with said current controlling switching element and said diode; and a reactor having a first and second end, said first end connected to a junction point between said current controlling switching element and said diode, said d.c. power source and said second end of said reactor being connected to said laser diode;

said current controlling switching element performing on-off control so that a value of a current through said reactor becomes equal to a command value, thereby supplying at a predetermined value said current to one of said laser diode and said shorting circuit.

3. A power source control apparatus according to claim 2, in which said current controlling switching element is turned on in advance when the laser output command signal is off so that said value of a current through said reactor becomes equal to said command value, said laser output command signal being turned on thereafter, said current controlling switching element being turned off after said laser output command signal is turned off.

4. A power source control apparatus according to claim 1, further comprising one or both of a reverse-biased diode and a resistor connected in parallel with said laser diode at a position near said laser diode.

5. A power source control apparatus according to claim 4, in which a plurality of laser diodes are connected in series, one or both of said diode and said resistor being connected in parallel with each said laser diode, a plurality of said resistors having the same resistance.

6. A power source control apparatus according to claim 1, in which a power source voltage of said constant current source circuit is approximately twice as large as a total value of said forward voltage drop of said laser diode.

7. A power source control apparatus according to claim 1, further comprising a solid state laser medium which is excited by the laser beam output from said laser diode thereby to generate a laser beam.

8. A power source control apparatus for a laser diode, comprising:

a laser diode;

a switching element connected in parallel between an anode and a cathode of said laser diode;

a driver circuit driving said laser diode, said driver circuit comprising a constant current source circuit that supplies current to said laser diode, the current being switched to one of said laser diode and said switching element; and a cooler made by assembling metal plates;

wherein said laser diode, said switching element and said driver circuit are mounted on said cooler.

9. A power source control apparatus comprising:

a laser diode;

a switching element connected in parallel between an anode and a cathode of said laser diode;

a driver circuit driving said laser diode; and a cooler made by assembling metal plates, said cooler defining one electrode;

wherein said laser diode, said switching element and said driver circuit are mounted on said cooler;

and wherein said laser diode and said switching element have one ends electrically and mechanically connected to said cooler;

and wherein another electrode is disposed between said laser diode and said switching element, said another electrode being insulated from said cooler;

and wherein said laser diode and said switching element have another ends electrically connected to said another electrode;

and wherein a drive control circuit is disposed on said cooler to drive and control said switching element and said laser diode.

10. A power source control apparatus comprising:

a laser diode;

a switching element connected in parallel between an anode and a cathode of said laser diode;

a driver circuit driving said laser diode;

a cooler made by assembling metal plates; and, a coolng pipe circulating cooling water therein, said cooling water flowing in said cooling pipe so as to cool said cooler;

wherein said laser diode, said switching element and said driver circuit are mounted on said cooler.

* * * * *